United States Patent
Bayer et al.

(10) Patent No.: US 8,198,783 B2
(45) Date of Patent: *Jun. 12, 2012

(54) PIEZOELECTRIC ACTUATOR WITH ENCAPSULATION LAYER HAVING A THICKNESS-VARYING PROPERTY GRADIENT

(75) Inventors: Heiner Bayer, Olching (DE); Hellmut Freudenberg, Grossberg (DE); Axel Ganster, Schwindegg (DE); Christoph Hamann, Thalmassing (DE); Oliver Henning, München (DE); Jens Dahl Jensen, Berlin (DE); Günter Lugert, München (DE); Randolf Mock, Hohenbrunn (DE); Carsten Schuh, Baldham (DE)

(73) Assignee: Siemens Aktiengesellschaft, Munich (DE)

( * ) Notice: Subject to any disclaimer, the term of this patent is extended or adjusted under 35 U.S.C. 154(b) by 586 days.

This patent is subject to a terminal disclaimer.

(21) Appl. No.: 12/298,116

(22) PCT Filed: Apr. 24, 2007

(86) PCT No.: PCT/EP2007/053990
§ 371 (c)(1),
(2), (4) Date: Jun. 29, 2009

(87) PCT Pub. No.: WO2007/125059
PCT Pub. Date: Nov. 8, 2007

(65) Prior Publication Data
US 2009/0278423 A1    Nov. 12, 2009

(30) Foreign Application Priority Data
Apr. 28, 2006 (DE) .................. 10 2006 019 900

(51) Int. Cl.
H01L 41/08 (2006.01)
H01L 41/047 (2006.01)
(52) U.S. Cl. .................. 310/328; 310/363; 310/364
(58) Field of Classification Search .................. 310/328, 310/364–366
See application file for complete search history.

(56) References Cited

U.S. PATENT DOCUMENTS

| | | | | |
|---|---|---|---|---|
| 6,700,308 B2* | 3/2004 | Heinz | ............. | 310/328 |
| 6,845,920 B2* | 1/2005 | Sato et al. | ............. | 239/102.1 |
| 7,024,737 B2* | 4/2006 | Schuh et al. | ............. | 29/25.35 |
| 7,061,160 B2* | 6/2006 | Leo et al. | ............. | 310/328 |
| 7,443,077 B2* | 10/2008 | Iwase et al. | ............. | 310/328 |
| 7,564,169 B2* | 7/2009 | Dollgast et al. | ............. | 310/328 |
| 7,808,160 B2* | 10/2010 | Kronberger | ............. | 310/346 |

(Continued)

FOREIGN PATENT DOCUMENTS
DE    19753930    12/1997
(Continued)

OTHER PUBLICATIONS

International Search Report; PCT/EP2007/053990; pp. 2, Jul. 11, 2007.

*Primary Examiner* — Jaydi San Martin
(74) *Attorney, Agent, or Firm* — King & Spalding L.L.P.

(57) ABSTRACT

In a method for the production of a gradient encapsulation layer 20 on a piezoelectric actuator 1, based on this gradient encapsulation layer 20, the piezoelectric actuator 1 does not require an additional housing-like enveloping structure in order to be protected externally. The gradient encapsulation layer 20 is produced by cold gas spraying of particles having different material properties.

10 Claims, 1 Drawing Sheet

U.S. PATENT DOCUMENTS

| | | | |
|---|---|---|---|
| 7,851,978 B2 * | 12/2010 | Bayer et al. | 310/340 |
| 7,868,524 B2 * | 1/2011 | Florian et al. | 310/366 |
| 7,990,023 B2 * | 8/2011 | De Paoli et al. | 310/328 |
| 8,058,777 B2 * | 11/2011 | Goat et al. | 310/340 |
| 2002/0084350 A1 | 7/2002 | Kawazoe et al. | 239/102.2 |
| 2004/0043230 A1 | 3/2004 | Hatono et al. | 428/458 |
| 2006/0170310 A1 * | 8/2006 | Leo et al. | 310/328 |

FOREIGN PATENT DOCUMENTS

| | | |
|---|---|---|
| DE | 10164246 | 12/2001 |
| DE | 102007040508 A1 * | 3/2009 |
| EP | 587192 A1 * | 3/1994 |
| JP | 62113487 A * | 5/1987 |
| JP | 01137686 | 5/1989 |
| JP | 02094680 | 4/1990 |
| JP | 4359577 A | 12/1992 |
| JP | 5003351 A | 1/1993 |
| JP | 2001102649 | 4/2001 |
| JP | 2002033531 A | 1/2002 |
| JP | 2002319715 A | 10/2002 |
| JP | 2005324135 A | 11/2005 |
| WO | 01/48834 | 7/2001 |

* cited by examiner

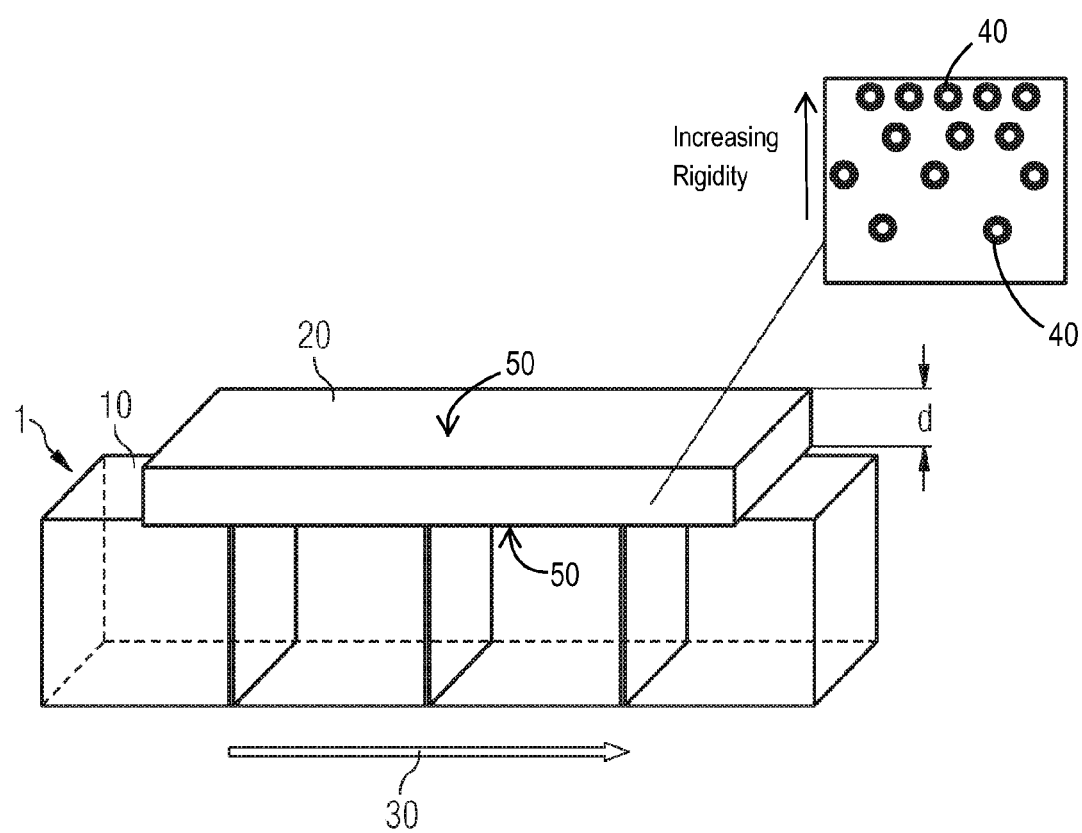

PIEZOELECTRIC ACTUATOR WITH ENCAPSULATION LAYER HAVING A THICKNESS-VARYING PROPERTY GRADIENT

CROSS-REFERENCE TO RELATED APPLICATIONS

This application is a U.S. National Stage Application of International Application No. PCT/EP2007/053990 filed Apr. 24, 2007, which designates the United States of America, and claims priority to German Application No. 10 2006 019 900.6 filed Apr. 28, 2006, the contents of which are hereby incorporated by reference in their entirety.

TECHNICAL FIELD

The present invention relates to a method for the production of a gradient encapsulation layer on a piezo actuator and to a piezo actuator with gradient encapsulation layer.

BACKGROUND

In recent years demand for piezo-ceramic actuators or, in short, piezo actuators has risen sharply owing to their increased use, for example in the latest diesel injection systems produced by the automobile industry. This demand has also encouraged development work on piezo actuators. In several new fuel-injection or injector designs the piezo actuators are completely surrounded by diesel fuel. This type of injection system is described as "wet design".

As the piezo actuators are chemically and electrically attacked in direct contact with diesel fuel which contains impurities or which has been modified with additives, a protective envelope has to be provided for the piezo actuator. The protective envelope should provide electrical insulation against a possible short circuit caused by the electrically conductive fuel as well as chemical insulation against attack by the surrounding fuel on the components of the piezo actuator.

In the state of the art metal housings of various designs are known which surround the piezo actuator. One example of such a metal housing is a corrugated tube. The metal housings are filled with suitable liquid filler materials to effect a transfer of the pressure applied by the fuel on the piezo actuator located inside, but this type of design has the disadvantages that it is expensive to manufacture and takes up a lot of space.

SUMMARY

A protection for a piezo actuator can be provided which ensures reliable electrical and chemical insulation of the piezo actuator against external influences.

According to an embodiment, a production method for a gradient encapsulation layer of a piezo actuator, so that the piezo actuator is protected externally without an additional housing-like enveloping structure, may comprise the following steps: a) Loading of a first powder conveyor with first particles of a first material which is chemically resistant to a selected medium; b) Loading of a second powder conveyor with second particles of a second material which possesses elastic material properties; c) Thermal spraying of the first and second particles using the first and second powder conveyor onto a surface of the piezo actuator in such a way that the gradient encapsulation layer is formed.

According to a further embodiment, the production method may comprise the further step of at least one of a proportion of first particles and a proportion of second particles is changed during the thrermal spraying so that in the gradient encapsulation layer as a function of its layer thickness at least one of a chemical material property and physical material property of at least one of the first and second particles determines at least one of a chemical layer property and physical layer property and this layer property changes with the layer thickness of the gradient encapsulation layer. According to a further embodiment, the production method may comprise the further step of cold gas spraying of metal particles as first particles in such a way that a chemically resistant metallic area is formed on an outer side of the gradient encapsulation layer. According to a further embodiment, the production method may comprise the further step of cold gas spraying of plastic-coated metal particles or plastic particles as second particles in such a way that on an inner side of the gradient encapsulation layer at the interface with the piezo actuator at least one of an elastic insulating area and electrically insulating area is formed. According to a further embodiment, the production method may comprise the further step of cold gas spraying of at least third particles so that a material property of the third particles can be generated as a function of their proportion in the gradient encapsulation layer.

According to another embodiment, a piezo actuator with gradient encapsulation layer, in particular a multilayer actuator, which is externally protected without an additional housing-like enveloping structure, may exhibits the following features: a) a piezo actuator preferably a multilayer actuator, b) the gradient encapsulation layer applied to an outer surface of the piezo actuator which exhibits at least one chemical and/or physical property which changes with increasing distance from the surface of the piezo actuator.

According to a further embodiment, the at least one of the chemical property and the physical property of the gradient encapsulation layer gradually may change with increasing distance from the surface of the piezo actuator. According to a further embodiment, the gradient encapsulation layer at the interface with the surface of the piezo actuator may exhibit a first area of elastic material behavior and at the interface with an outer side of the gradient encapsulation layer may exhibit a second area with chemically resistant material behavior. According to a further embodiment, the first area may be made of plastic or a plastic-metal mixture and whose second area is made of metal. According to a further embodiment, the gradient encapsulation layer may cover the side surfaces of the piezo actuator parallel to its stack direction or its entire surface.

BRIEF DESCRIPTION OF THE DRAWINGS

The invention is explained in more detail with reference to the accompanying drawing. This shows a schematic cross section of a piezo actuator with gradient encapsulation layer in accordance with an embodiment.

DETAILED DESCRIPTION

The above production method produces a gradient encapsulation layer on a piezo actuator so that the piezo actuator is protected externally without the need for an additional housing-like enveloping structure. This production method exhibits the following steps: a) loading of a first powder conveyor with first particles of a first material which is chemically resistant to a selected medium, b) loading of a second powder conveyor with second particles of a second material which possesses elastic material properties, and c) thermal spraying, in particular cold gas spraying, of the first and second particles with the aid of the first and second powder conveyor onto a surface of the piezo actuator in such a way that the gradient encapsulation layer is formed.

The method in accordance with an embodiment uses a thermal spraying method, in particular cold gas spraying. In this method the coating material does not need to be melted before it is applied to the surface. Instead, powder particles of different materials are sprayed onto the surface to be coated with high kinetic energy. When the individual particles hit the surface a local welding/melting zone is produced for each individual particle. While the cold-gas-sprayed particles form a layer on the surface of the piezo actuator, the properties of the starting material are not changed or are only changed a little. Particles of different materials or material compositions are therefore used to produce the gradient encapsulation layer on the piezo actuator, so that physical and/or chemical properties of the gradient encapsulation layer can be specifically imparted inside the gradient encapsulation layer. As the gradient encapsulation layer is being applied the proportion of different particles is changed, which produces different physical and/or chemical properties at different layer depths of the gradient encapsulation layer or at different distances from the surface of the piezo actuator within this layer.

In one configuration of the production method a proportion of first particles and/or a proportion of second particles is changed during cold-gas spraying so that in the gradient encapsulation layer as a function of its layer thickness a chemical and/or physical material property of the first and/or second particles determines a chemical and/or physical layer property and this layer property changes with the layer thickness of the gradient encapsulation layer.

In order to protect the piezo actuator adequately, for example when it used in diesel fuel under high pressure, the gradient encapsulation layer has to provide both chemical and mechanical protection. Chemical protection is ensured by the fact that the gradient encapsulation layer exhibits a metallic area at the interface with the surrounding diesel fuel which is resistant to the chemical attacks of the fuel. Such a metallic area is obtained by cold gas spraying of metal particles, preferably spherical metal particles.

To protect the outer metallic area from excessive elongation during normal operation of the piezo actuator, an area is produced preferably between the surface of the piezo actuator and the metallic area in the gradient encapsulation layer which exhibits good elastic deformability. These elastic properties, as provided for example by polymers or other plastics, suppress the normal operational elongation of the piezo actuator inside the gradient encapsulation layer with increasing distance from the surface of the piezo actuator, so that only a fraction of the elongation of the piezo actuator is transferred to the metallic area of the gradient encapsulation layer, which is therefore not damaged. Such an elastic area inside the gradient encapsulation layer can be generated by cold gas spraying of plastic-coated metal particles or by cold gas spraying of plastic particles as second particles. The plastic-coated metal particles are for example produced using the LBL technology from Capsulation NanoScience AG, Berlin.

It is also conceivable to impart the material properties of the second particles in such a way that in addition to the elastic material properties they also have an electrically insulating effect. This would be suitable for applying the second particles directly onto the surface of the piezo actuator so that a short circuit between protruding internal electrodes and negative effects e.g. from polarization cracks are prevented.

It is also conceivable to additionally conduct cold gas spraying of at least third particles, so that a material property of the third particles can be generated as a function of its proportion in the gradient encapsulation layer specifically in a layer thickness area of the gradient encapsulation layer as a layer property.

The piezo actuator with gradient encapsulation layer in accordance with an embodiment exhibits the following features: a) a piezo actuator, preferably a multilayer actuator, and b) the gradient encapsulation layer applied to an outer surface of the piezo actuator which exhibits at least one chemical and/or physical property which changes with increasing distance from the surface of the piezo actuator. Preferably this property of the gradient encapsulation layer changes gradually with increasing distance from the surface of the piezo actuator.

In accordance with an embodiment, the gradient encapsulation layer comprises a first area of elastic material behavior at the interface with the surface of the piezo actuator and a second area with chemically resistant material behavior at the interface with an outer side of the gradient encapsulation layer. This is achieved for example by having the first area made of plastic or a plastic-metal mixture and the second area made of metal.

The figure shows a schematic view of a piezo actuator 1 with a gradient encapsulation layer 20. The gradient encapsulation layer 20 is applied to the surface 10 of the piezo actuator 1. Preferably it extends on the surface 10 of the piezo actuator 1 parallel to its stack direction 30. In a further alternative the piezo actuator 1 is completely enclosed by the gradient encapsulation layer 20.

The gradient encapsulation layer 20 is produced by means of cold gas spraying. This method is a form of thermal spraying in which the coating material does not have to be melted before being applied to a surface. To produce the gradient encapsulation layer 20 by means of cold gas spraying the coating material is sprayed onto the surface 10 of the piezo actuator 1 in powder form with high kinetic energy. For this purpose, the starting materials of the gradient encapsulation layer 20 are supplied by known powder conveyors to a carrier gas, so that the carrier gas accelerates the particles of the coating material in the direction of the surface 10.

In addition to providing the particles for the coating material the powder conveyors are used to adjust the composition of the accelerated powder particles hitting the surface 10 of the piezo actuator 1. This is important for imparting the physical and chemical properties of the gradient encapsulation layer 20 specifically at different depths of the gradient encapsulation layer 20. Despite the layer formation the chemical and mechanical properties of the starting materials or of the powder particles applied during cold gas spraying are not changed or are only changed slightly. As a result, the properties provided by the particles are imparted in selected areas of the gradient encapsulation layer 20 as a function of how the proportion of particles of the starting materials or of the at least two powders is selected for the formation of the gradient encapsulation layer 20. If for example the surface 10 of the piezo actuator is coated with particles made of elastic plastic a layer having elastic material properties is formed. These elastic material properties can also be obtained in a different configuration if the surface 10 of the piezo actuator is coated with metal particles which have a plastic coating. Furthermore, it is preferable to conduct the cold gas spraying with a high proportion of or exclusively with metal particles, so that a metallic area is produced in the gradient encapsulation layer 20 which exhibits chemically insulating properties or is resistant to chemical attack.

The gradient encapsulation layer 20 on the surface 10 of the piezo actuator fulfils the following properties. Directly interfacing with the piezo actuator 1 it provides an electrically insulating area. This ensures that no short circuit takes place between internal electrodes protruding to the surface 10 of the piezo actuator. In addition, the material properties of the electrically insulating area are such that it does not penetrate into possible pores or polarization cracks on the surface 10 of the piezo actuator 1. In this way the gradient encapsulation layer 20 prevents the propagation of cracks and does not support possible failure of the piezo actuator 1 caused by such. It is also preferable for the gradient encapsulation layer 20 to exhibit elastic properties near the surface 10 of the piezo actuator. This ensures that during operation of the piezo actuator its elongation vertically to the stack direction 30 is suppressed with increasing layer thickness and at the same time operation of the piezo actuator 1 is not impeded.

If the piezo actuator 1 with gradient encapsulation layer 20 for example in wet design is used it is permanently surrounded by chemically aggressive fuel. To protect the piezo actuator 1 from chemical attack and damage a metallic area is produced in the gradient encapsulation layer 20. This metallic area forms the outer boundary of the gradient encapsulation layer 20 and thus the interface to the surrounding chemically aggressive medium. Particles made of metal(s) which are chemically resistant to attack by fuels are suitable for use as the coating material. A suitable metal can be selected depending on the surrounding medium and the metal's amenability to processing, so that chemical insulation of piezo actuator 1 and gradient encapsulation layer 20 against an aggressive medium is ensured.

During operation of the piezo actuator 1 the metallic area on the outside of the gradient encapsulation layer 20 has to contend with elongations of the piezo actuator which are transferred through the gradient encapsulation layer 20 to the metallic area. For this reason, the gradient encapsulation layer 20 is configured in such a way that the elongations of the piezo actuator up to the metallic or generally up to the chemically resistant area are suppressed to such an extent that the residual elongation transferred does not damage or destroy the metallic area of the gradient encapsulation layer 20.

To achieve the above properties of the gradient encapsulation layer 20 it is produced in accordance with the following configuration. Using cold gas spraying as mentioned above spherical metal particles with and without plastic coating are sprayed onto the surface 10 of the piezo actuator 1. In order to initially produce an elastic and electrically insulating area on the surface 10 of the piezo actuator 1 a particle mixture with a high proportion of plastic-coated metal particles is sprayed on. The metal particles with plastic coating are for example produced using LBL technology (layer-by-layer technology) from Capsulation NanoScience AG, Berlin. It is also conceivable to coat the surface 10 of the piezo actuator 1 initially only or with a high proportion of plastic particles in order to obtain the elastic and electrically insulating properties of the gradient encapsulation layer 20.

In addition it is necessary as discussed above to suppress the elongation of the piezo actuator inside the gradient encapsulation layer 20 with increasing distance from the surface 10 vertically to the stack direction 30. For this purpose a material gradient is created in the gradient encapsulation layer 20 in such a way that the rigidity of the gradient encapsulation layer 20 increases with increasing distance from the piezo actuator 1. In order to impart an increasing rigidity in the gradient encapsulation layer 20, the gradient encapsulation layer 20 is produced with a successively increasing proportion of metal particles without plastic coating, such particles indicated by reference number 40, as the layer thickness increases. It is also conceivable to use particles of other materials which through their admixture have a mechanically stiffening effect on the gradient encapsulation layer 20. One alternative is to use ceramic particles in the coating.

In the production of the gradient encapsulation layer 20 the proportion of particles used is therefore changed as a function of their material properties in such a way that a property gradient is created over the layer thickness d of the gradient encapsulation layer 20. The rigidity of the gradient encapsulation layer 20 therefore preferably increases with increasing distance from the surface 10 of the piezo actuator. In addition, the electrical conductivity for example increases with increasing distance from the surface 10 if metal particles without plastic coating are mixed in as stiffening particles. The chemical resistance preferably decreases from outside to inside if on the outside of the gradient encapsulation layer 20 a metallic area exhibits a predominant proportion of metal or is formed exclusively from metal particles and the proportion of metal particles decreases in the layer formation in the direction of the piezo actuator 1.

Compared with encapsulation methods used up to now for piezo actuators 1 a more compact arrangement is obtained which, in addition, brings about a minimal suppression of the elongation behavior in stack direction 30 during operation of the piezo actuator 1. Furthermore, a simpler design exists which requires neither a metal encapsulation nor a pressure transfer medium between the piezo actuator 1 and the metal encapsulation. A further advantage exists in that the above coating method requires only a small amount of time and material compared with the installation of piezo actuators in metal encapsulations.

The above production method thus provides a piezo actuator 1 with gradient encapsulation layer 20 within which at least one chemical and physical property gradually changes with increasing distance from the surface 10 of the piezo actuator 1. This gradient encapsulation layer 20 preferably comprises a first area 50 of elastic material behavior, advantageously made of plastic or a plastic-metal mixture, at the interface with the surface 10 of the piezo actuator 1 and a second area 60 exhibiting chemically resistant material behavior, advantageously made of metal or a comparably chemically resistant material, at the interface with the outside of the gradient encapsulation layer 20.

The invention claimed is:

1. A piezo actuator with gradient encapsulation layer, which is externally protected without an additional housing-like enveloping structure and which comprises:
   a) a piezo actuator,
   b) the gradient encapsulation layer applied to an outer surface of the piezo actuator which exhibits at least one of a chemical property and physical property which changes with increasing distance from the surface of the piezo actuator.

2. The piezo actuator with gradient encapsulation layer according to claim 1, wherein the at least one of the chemical property and the physical property of the gradient encapsulation layer gradually changes with increasing distance from the surface of the piezo actuator.

3. The piezo actuator with gradient encapsulation layer according to claim 1, whose gradient encapsulation layer at the interface with the surface of the piezo actuator exhibits a first area of elastic material behavior and at the interface with an outer side of the gradient encapsulation layer exhibits a second area with chemically resistant material behavior.

4. The piezo actuator with gradient encapsulation layer according to claim 3, whose first area is made of plastic or a plastic-metal mixture and whose second area is made of metal.

5. The piezo actuator with gradient encapsulation layer according to claim 1, whose gradient encapsulation layer covers the side surfaces of the piezo actuator parallel to its stack direction or its entire surface.

6. A piezo actuator comprising:
   a) a multilayer piezo actuator,
   b) a gradient encapsulation layer applied to an outer surface of the multilayer piezo actuator which exhibits at least one of a chemical property and physical property which changes with increasing distance from the surface of the multilayer piezo actuator.

7. The piezo actuator according to claim 6, wherein the at least one of the chemical property and the physical property of the gradient encapsulation layer gradually changes with increasing distance from the surface of the multilayer piezo actuator.

8. The piezo actuator according to claim 6, whose gradient encapsulation layer at the interface with the surface of the multilayer piezo actuator exhibits a first area of elastic material behavior and at the interface with an outer side of the gradient encapsulation layer exhibits a second area with chemically resistant material behavior.

9. The piezo actuator according to claim 8, whose first area is made of plastic or a plastic-metal mixture and whose second area is made of metal.

10. The piezo actuator according to claim 6, whose gradient encapsulation layer covers the side surfaces of the multilayer piezo actuator parallel to its stack direction or its entire surface.

* * * * *

UNITED STATES PATENT AND TRADEMARK OFFICE
CERTIFICATE OF CORRECTION

| | | |
|---|---|---|
| PATENT NO. | : 8,198,783 B2 | |
| APPLICATION NO. | : 12/298116 | |
| DATED | : June 12, 2012 | |
| INVENTOR(S) | : Heiner Bayer et al. | |

It is certified that error appears in the above-identified patent and that said Letters Patent is hereby corrected as shown below:

<u>Face page,</u>
Block (75) Inventors, "Oliver Henning" should read -- OLIVER HENNIG --.

Signed and Sealed this
Twenty-seventh Day of November, 2012

David J. Kappos
*Director of the United States Patent and Trademark Office*